US009806685B1

(12) United States Patent
Hansen

(10) Patent No.: US 9,806,685 B1
(45) Date of Patent: Oct. 31, 2017

(54) TRANS-IMPEDANCE AMPLIFIER WITH INCREASED DYNAMIC RANGE

(71) Applicant: MKS Instruments, Inc., Andover, MA (US)

(72) Inventor: Douglas C. Hansen, Boulder, CO (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/153,915

(22) Filed: May 13, 2016

(51) Int. Cl.
*H03F 3/68* (2006.01)
*H03F 3/45* (2006.01)
*H03F 1/34* (2006.01)

(52) U.S. Cl.
CPC ............... *H03F 3/45* (2013.01); *H03F 1/34* (2013.01); *H03F 2200/153* (2013.01); *H03F 2203/45161* (2013.01); *H03F 2203/45288* (2013.01)

(58) Field of Classification Search
CPC ............... H03F 1/14; H03F 3/08; H03F 3/68
USPC .......................................... 330/51, 295, 308
See application file for complete search history.

(56) References Cited

U.S. PATENT DOCUMENTS 6,798,282 B1   9/2004 Broekaert
8,896,950 B1 * 11/2014 Polley et al. ............ G11B 5/09
                                                       360/46

FOREIGN PATENT DOCUMENTS

WO   WO 2011/008569   1/2011

OTHER PUBLICATIONS

Eckel, S., et al., "Note: A high dynamic range, linear, response transimpedance amplifier", Review of Scientific Instruments, vol. 83, No. 2, dated Feb. 14, 2012.
International Search Report and Written Opinion of PCT/US2017/032095 dated Jul. 21, 2017, entitled "Trans-Impedance Amplifier With Increased Dynamic Range".

* cited by examiner

*Primary Examiner* — Steven J Mottola
(74) *Attorney, Agent, or Firm* — Hamilton, Brook, Smith & Reynolds, P.C.

(57) ABSTRACT

A wide dynamic range trans-impedance amplifier includes a first trans-impedance amplifier configured to receive a first input current and produce a first voltage as a function of the first input current, and a second trans-impedance amplifier configured to receive a second input current and produce a second voltage as a function of the second input current. A current steering element causes a first portion of current from a current source to flow to the first trans-impedance amplifier until the first current portion reaches the first threshold current, and causes a second portion of current from the current source to flow to the second trans-impedance amplifier, until the second current portion reaches the second threshold current. The second current portion is current from the current source that exceeds the first threshold current. The wide dynamic range trans-impedance amplifier may receive, for example, ion collector current from a hot cathode ionization gauge (HCIG).

21 Claims, 16 Drawing Sheets

TRANS-IMPEDANCE AMPLIFIER WITH INCREASED DYNAMIC RANGE

BACKGROUND

Ionization vacuum pressure gauges can be used in a wide variety of applications such as semiconductor manufacturing, thin film deposition, high energy physics, ion implantation, and space simulation. Ionization gauges can include both cold cathode ionization gauges (CCIGs) and hot cathode ionization gauges (HCIGs), and some example HCIG designs include Bayard-Alpert (BA), Schulz-Phelps, and triode gauges.

The sensor of a typical hot cathode ionization vacuum pressure gauge, shown in FIG. 1, includes a cathode 130 (the electron source, also called the filament), an anode 132 (also called the grid), and an ion collector electrode 134. For the BA gauge, the cathode 130 is located radially outside of an ionization space (anode volume) defined by the anode 132.

The ion collector electrode 134 is disposed within the anode volume. Electrons travel from the cathode 130 toward and through the anode 132, and are eventually collected by the anode 132. In their travel, the electrons impact molecules and atoms of gas, constituting the atmosphere whose pressure is to be measured, and create ions. The ions created inside the anode volume are attracted to the ion collector electrode 134 by the electric field inside the anode, thereby producing an ion collector current 104.

The pressure P of the gas within the atmosphere can be calculated from ion and electron currents by the formula $P=(1/S)(i_i/i_e)$, where S is a scaling coefficient (gauge sensitivity) with the units of 1/torr and is characteristic of a particular gauge geometry, electrical parameters, and pressure range; and $i_i$ is the ion collector current and $i_e$ is the electron emission current.

The expected dynamic range of ion collector current $i_i$ may span several decades. Measuring a current with such a wide dynamic range can present several challenges, including, but not limited to, operational discontinuities, higher cost, increased complexity and undesirable calibration demands.

For example, a logarithmic amplifier may be used to compress the dynamic range of a current into a compressed logarithmic range, but calibration of logarithmic amplifiers may be time-consuming and may add complexity to the ion collector current measurement system. Further, since logarithmic conversion is an old technology, the number of log converter devices on the market is small and they tend to be expensive.

In another example, a programmable-gain amplifier can apply different gains to the input current, depending on the magnitude of the input current. But discontinuities in the amplifier output may occur when the amplifier gain switches from one value to another, creating undesirable gaps in the current measurement.

SUMMARY OF THE INVENTION

The described embodiments present a wide dynamic range amplifier that generates an output corresponding to a received current, for example an ion collector current (also referred to herein as "collector current") produced by a hot cathode ionization gauge (HCIG). One embodiment may be a wide dynamic range trans-impedance amplifier that produces a voltage output corresponding to the collector current. Although some of the descriptions herein utilize the ion collector current from an HCIG as an example input for a wide dynamic range trans-impedance amplifier, such an example current input is not intended to be limiting. The described embodiments may be used to receive, amplify and otherwise process current from sources other than HCIGs.

A wide dynamic range amplifier may be implemented with multiple gain stages, each of which is capable of providing linear amplification within a particular dynamic range. The gain stages may then be combined to provide linear amplification across a wide dynamic range.

If the input current to a gain stage exceeds the linear range of that gain stage, the gain stage may enter a non-linear mode, also referred to as a saturation mode. When the input to a gain stage in saturation mode drops back into the linear range of the gain stage, a finite amount of time may be required before the gain stage resumes operating linearly. This finite "un-saturate" time may create discontinuities in the overall output as the input current varies across the boundaries of the gain stage dynamic ranges. As used herein, the "saturation current" of a gain stage is the minimum current for which a gain stage begins to exhibit non-linear input-to-output characteristics.

To mitigate the above-described discontinuity issue, the described embodiments utilize a current steering element that limits current being input to each gain stage to a threshold current less than the saturation current of the gain stage. In other words, the current steering element enables the gain stage to maintain a linear input-to-output characteristic by steering away current that would otherwise cause the gain stage to saturate.

Although several example embodiments presented herein describe two trans-impedance amplifiers (high-gain and low-gain), it should be understood that other embodiments may utilize more than two trans-impedance amplifiers. For such embodiments, each of the two or more trans-impedance amplifiers handles a portion of the total dynamic range of the input current, and the current steering circuit controls the portion of input current flowing to each of the two or more trans-impedance amplifiers.

Example embodiments described herein may include a high-gain linear amplifier, a low-gain linear amplifier, and a current steering element. When the collector current is within the low portion of its dynamic range, the current steering element causes all collector current to be steered to the high-gain linear amplifier.

As the collector current increases and the high-gain linear amplifier approaches saturation mode, the current steering element gradually causes a portion of the collector current to be steered to the low gain linear amplifier. The redirection of incremental collector current prevents the high-gain linear amplifier from entering saturation mode.

As the collector current further increases and the low-gain amplifier approaches saturation mode, the current steering element may cause additional incremental collector current to be steered to a bleed-off path. The output of the high-gain linear amplifier and the low-gain linear amplifier may be sampled and combined to produce an aggregate output corresponding to the received collector current. Steering excess current to a bleed-off path may protect the wide dynamic range amplifier from potential overcurrents in particular environments. The bleed-off path, however, may introduce a small amount of leakage current, and therefore may slightly decrease accuracy and dynamic range of the wide dynamic range amplifier. While some embodiments include such an excess current steering capability, other embodiments may not include the described excess current steering capability.

In one aspect, the invention may be a wide dynamic range trans-impedance amplifier, including a first trans-impedance amplifier configured to receive a first input current and produce a first voltage being a function of the first input current. The first trans-impedance amplifier may be characterized by a first saturation current at which the first trans-impedance amplifier ceases to produce the first voltage as a linear function of the first input current. The first trans-impedance amplifier may also have a first gain characteristic. The wide dynamic range amplifier may further include a second trans-impedance amplifier configured to receive a second input current and produce a second voltage being a function of the second input current. The second trans-impedance amplifier may be characterized by a second saturation current at which the second trans-impedance amplifier ceases to produce the second voltage as a linear function of the second input current. The second trans-impedance amplifier may further have a second gain characteristic. The wide dynamic range amplifier may also include a current steering element configured to (i) cause the first input current to flow from a current source to the first trans-impedance amplifier until the first input current reaches a first threshold current that is less than the first saturation current, and (ii) when the first input current reaches the first threshold current, cause the second input current to flow from the current source to the second trans-impedance amplifier until the second input current reaches a second threshold current that is less than the second saturation current, the second input current being current from the current source that exceeds the first threshold current.

In one embodiment, the current steering element is further configured to cause an excess portion of current from the current source to flow to a bleed-off path when the second input current to the second trans-impedance amplifier reaches the second threshold current. The excess portion of current is current from the current source that exceeds a sum of the first threshold current and the second threshold current.

Another embodiment further includes one or more additional trans-impedance amplifiers. The current steering element is further configured to cause one or more additional portions of the excess portion of current to flow to each subsequent trans-impedance amplifier of the one or more additional trans-impedance amplifiers, until the additional current portion flowing to the subsequent trans-impedance amplifier reaches a subsequent threshold current corresponding to the subsequent trans-impedance amplifier.

One embodiment further includes a voltage output aggregation element configured to (i) sample the first voltage and the second voltage, (ii) determine a first ratio of the first voltage to a feedback resistance associated with the first trans-impedance amplifier, (iii) determine a second ratio of the second voltage to a feedback resistance associated with the second trans-impedance amplifier, and (iv) add the first ratio and the second ratio to produce an estimate of the source current. Another embodiment may further include an analog-to-digital converter (ADC) configured to digitize the first voltage producing a first digitized voltage, and to digitize the second voltage producing a second digitized voltage, and a processor system configured to (i) generate the first ratio and the second ratio, and (ii) add the first ratio and the second ratio to produce an estimate of the source current.

In one embodiment, the current steering element is configured to control the first input current and the second input current based on the first voltage, by causing a control diode to become forward-biased as the first voltage increases beyond a first threshold voltage. The control diode becoming forward-biased may be configured to cause a steering diode to become forward biased, which conveys the second input current from the current source to the second trans-impedance amplifier. The steering diode may become forward-biased by modifying an input bias voltage of the second trans-impedance amplifier.

In one embodiment, the first gain characteristic is greater than the second gain characteristic. In another embodiment, the second input current begins flowing without a discontinuity as the first current to the first trans-impedance amplifier reaches the first threshold current.

In another aspect, the invention may be a method of amplifying a current from a current source, the current having a wide dynamic range, including causing the current to flow to a first trans-impedance amplifier, which may be characterized by a first gain characteristic and a first saturation current. When the current to the first trans-impedance amplifier reaches a first threshold current that is less than the first saturation current, the method may cause a portion of the current from the current source to flow to a second trans-impedance amplifier characterized by a second gain characteristic and a second saturation current, until the portion of current to the second trans-impedance amplifier reaches a second threshold current that is less than the second saturation current. The portion of current to the second trans-impedance amplifier is current from the current source that exceeds the first threshold current.

The method may further include sampling a first voltage from the first trans-impedance amplifier, the first voltage being a function of the current to the first trans-impedance amplifier. The method may also include sampling a second voltage from the second trans-impedance amplifier, the second voltage being a function of the current to the second trans-impedance amplifier. The method may also include determining a first ratio of the first voltage to a feedback resistance associated with the first trans-impedance amplifier, determining a second ratio of the second voltage to a feedback resistance associated with the second trans-impedance amplifier, and adding the first ratio and the second ratio to produce an estimate of the current from the current source. Another embodiment may further include digitizing the first voltage to produce a first digitized voltage, digitizing the second voltage to produce a second digitized voltage, and generating, the first ratio, the second ratio, and a sum of the first ratio and the second ratio to produce an estimate of the current from the current source.

In another aspect, the invention may be a non-transitory computer-readable medium with computer code instruction stored thereon. The computer code instructions, when executed by an a processor, may cause an apparatus to perform the methods described herein.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

Figure 2:
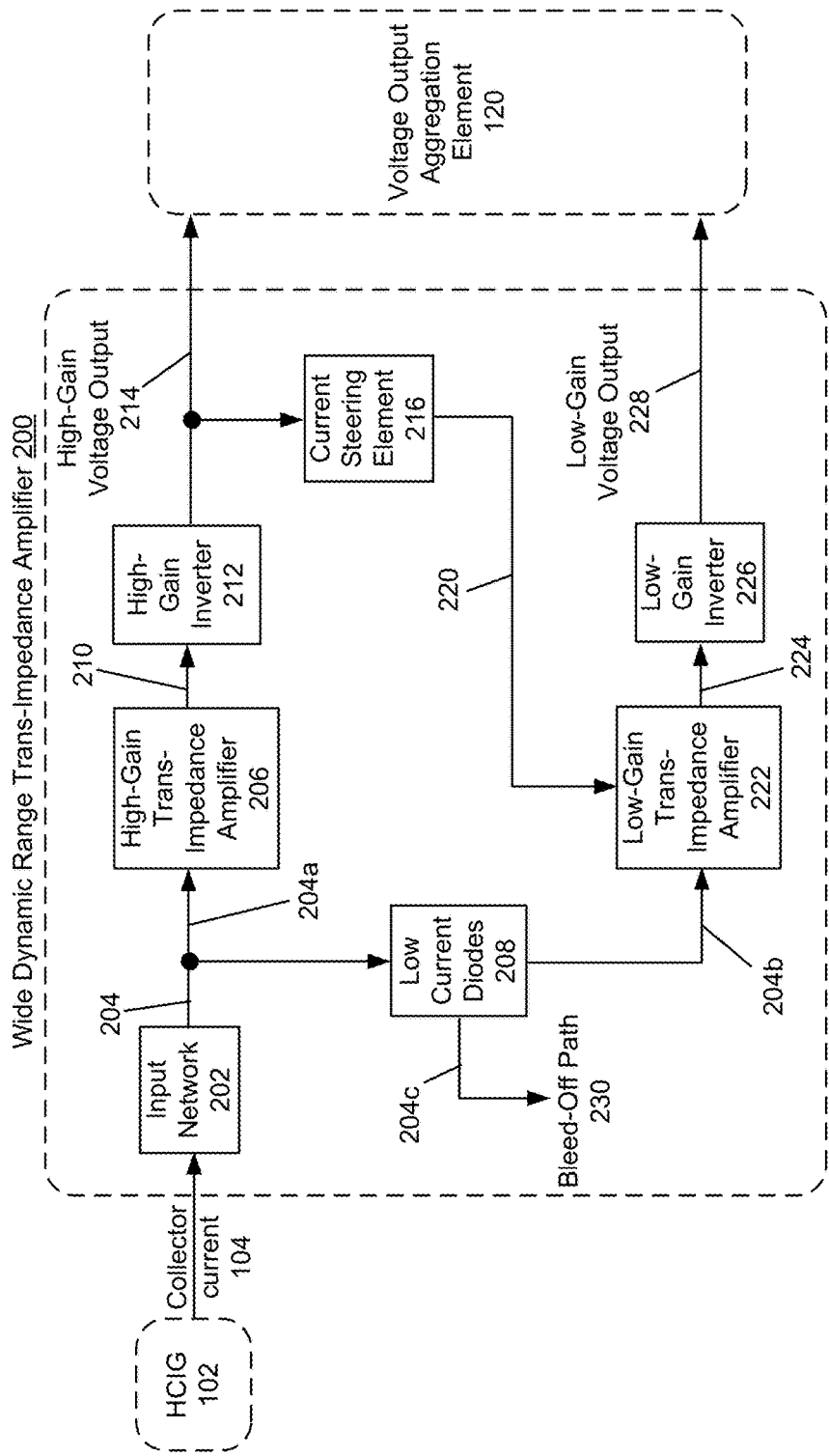
FIG. 2 illustrates an example embodiment of a wide dynamic range trans-impedance amplifier according to the invention.

FIG. 2 illustrates an example embodiment of a wide dynamic range trans-impedance amplifier 200 according to the invention. FIGS. 3 through 9 provide more detail of each of the example block elements of the embodiment shown in FIG. 2. The embodiments presented in FIGS. 3 through 9 are not intended to be limiting, but are rather intended to provide an example description of a specific implementation of the described embodiments.

Figure 1:
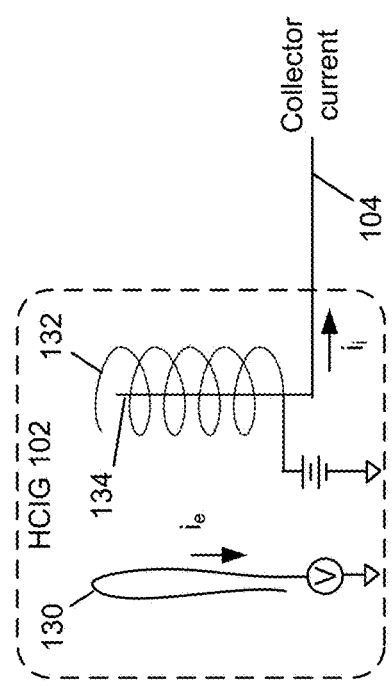
FIG. 1 illustrates a prior-art hot cathode ionization gauge (HCIG).

Input network 202 receives collector current 104 from HCIG 102 (see also FIG. 1). The input network 202 provides conditioned collector current 204 to a high-gain trans-impedance amplifier 206 and also to a set of low current diodes 208. A first portion of conditioned collector current 204 flows to the high-gain trans-impedance amplifier 206. A second portion 204b of conditioned collector current 204 may flow to the low current diodes 208. As is described in more detail below, all conditioned collector current 204 flows to the high-gain trans-impedance amplifier 206 when the collector current 204 is at the low end of its dynamic range.

The high-gain trans-impedance amplifier 206 amplifies the conditioned collector current 204 to produce the inverted high-gain voltage output 210, which a high-gain inverter 212 inverts, to produce the high-gain voltage output 214.

The current steering element 216 provides a current control signal 220 to the low-gain trans-impedance amplifier 222. The value of the current control signal 220 depends on the value of the high-gain voltage output 214. The current control signal 220 controls, through the low-gain trans-impedance amplifier 222, the amount of conditioned collector current portion 204b that flows through the low current diodes 208. Before the conditioned collector current 204 reaches a level that may begin to saturate the high-gain trans-impedance amplifier 206, as indicated by the high-gain voltage output 214, the current steering element 216 causes additional collector current 204b to flow through the low current diodes 208 to the low-gain trans-impedance amplifier 222. The current control signal 220 therefore limits the input current to the high-gain trans-impedance amplifier to a maximum amount that maintains a linear input-to-output relationship at the high-gain trans-impedance amplifier.

The low-gain trans-impedance amplifier 222 amplifies the output conditioned collector current portion 204b to produce the inverted low-gain voltage output 224, which a low-gain inverter 226 inverts, to produce the low-gain voltage output 228. The control signal 220 controls the amount of conditioned collector current 204b available for the low-gain trans-impedance amplifier 222 to amplify. Before the output conditioned collector current 204b reaches a level that may begin to saturate the low-gain trans-impedance amplifier, additional conditioned collector current 204c flows to a bleed-off path 230. The current control signal 220 therefore limits the input current to the low-gain trans-impedance amplifier to a maximum amount that maintains a linear input-to-output relationship at the low-gain trans-impedance amplifier.

A voltage output aggregation element 120 may simultaneously sample the high-gain voltage output 214 and the low-gain voltage output 228. The voltage output aggregation element 120 may determine the collector current 104 by summing (i) the ratio of the high-gain voltage output to the feedback resistance of the high-gain trans-impedance amplifier and (ii) the ratio of the low-gain voltage output to the feedback resistance associated with the low-gain trans-impedance amplifier. The equation below shows the equation for determining the collector current 104 specific to the example embodiment set forth in FIGS. 3-9:

collector current=(high-gain voltage output/10 M$\Omega$)+ (low-gain voltage output/15 k$\Omega$)

Figure 2A:
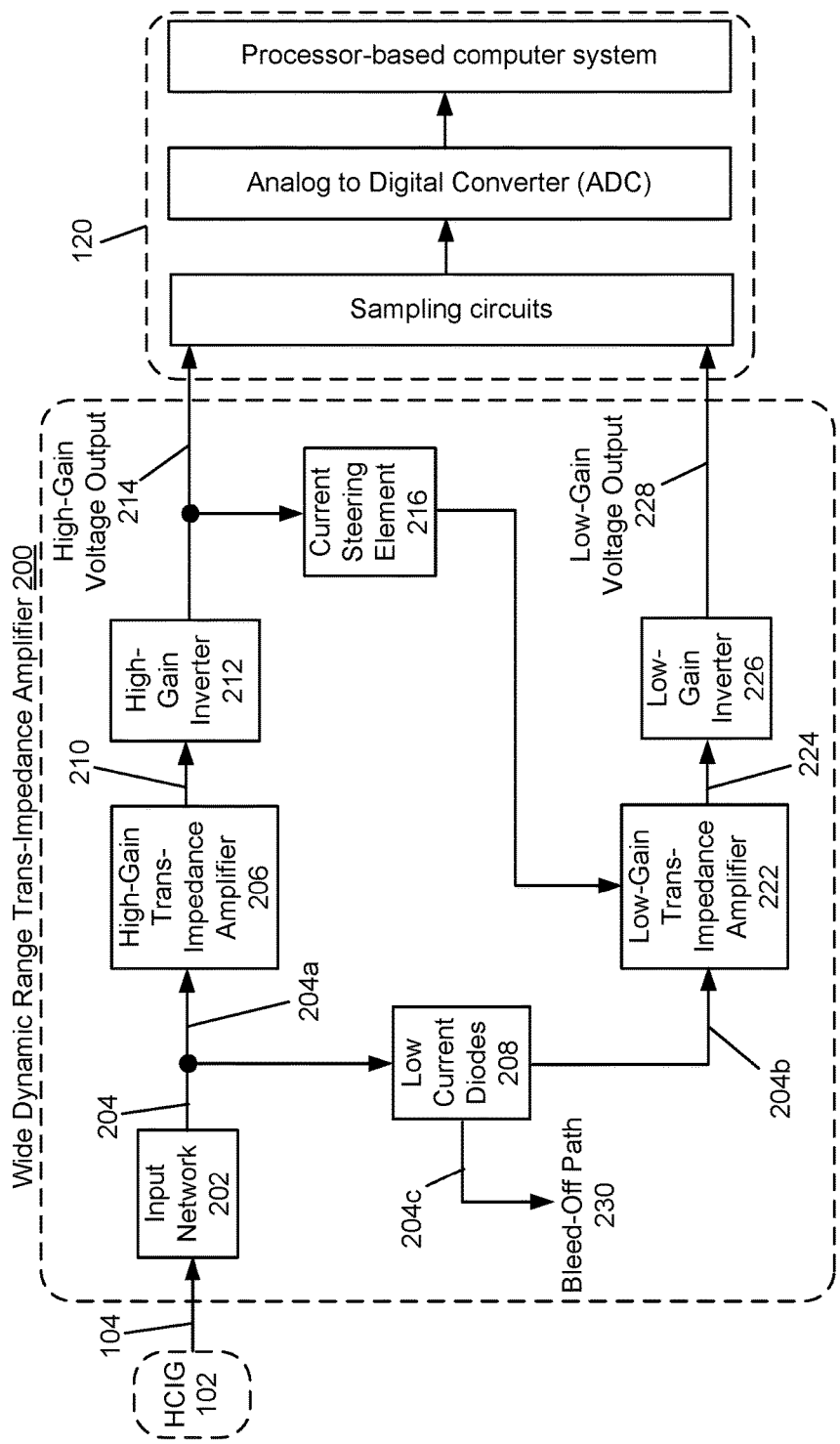
FIG. 2A shows the example embodiment of FIG. 2, further depicting the voltage output aggregation element as described herein.

In some embodiments, the voltage output aggregation element 120 may be implemented with an analog to digital converter (ADC) in conjunction with sampling circuits and a processor-based computer system, as shown in FIG. 2A. In other embodiments, the voltage output aggregation element 120 may be implemented with analog circuits, digital circuits, a combination thereof, or analog and/or digital circuits combined with a processor-based system.

For the purposes of simplicity and clarity in the descriptions presented herein, a reference number associated with a signal may also be used to refer to the electrical conductor conveying the signal. For example, reference to collector current 104 may refer to the collector current flowing through a conductor, as well as the conductor conveying the collector current.

Figure 3:
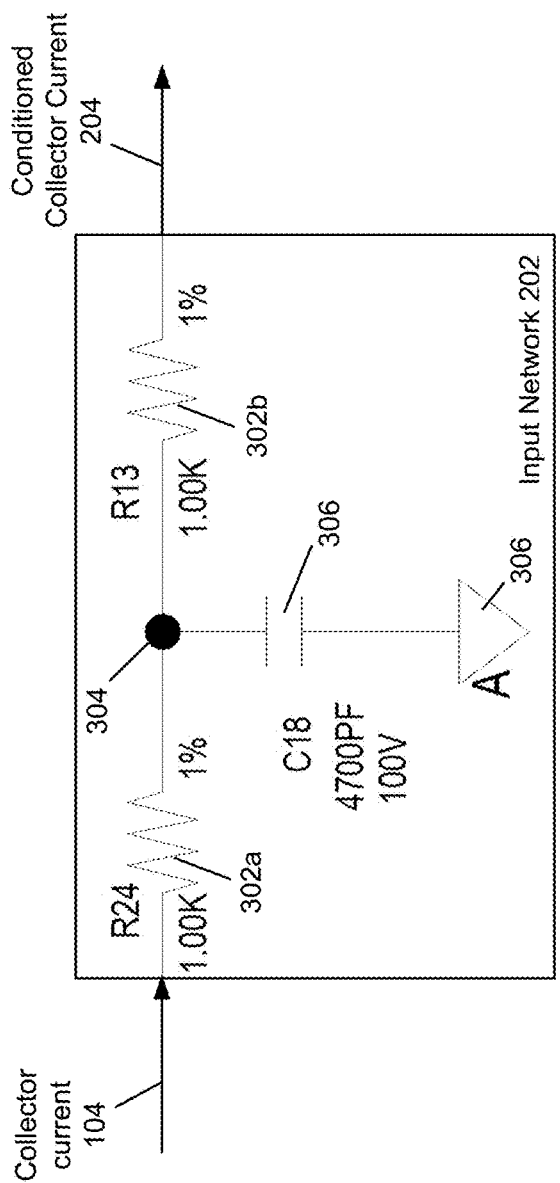
FIG. 3 shows an example embodiment of the input network of FIG. 2.

FIG. 3 shows an example embodiment of the input network 202 of FIG. 2, which includes a pair of 1 k$\Omega$ resistors 302a and 302b, which are series-connected at a node 304. Resistor 302a is also electrically connected to the collector current 104, such that the collector current 104 may flow through the resistor 302a to node 304. Resistor 302b is also connected to a conditioned collector current 204, such that the conditioned collector current 204 flows through resistor 302b. A 4700 pF capacitor 306 is electrically connected between the node 304 and analog ground 308. The input network 202 conditions the collector current 104 for use by subsequent components of the wide dynamic range trans-impedance amplifier 200.

Figure 4:
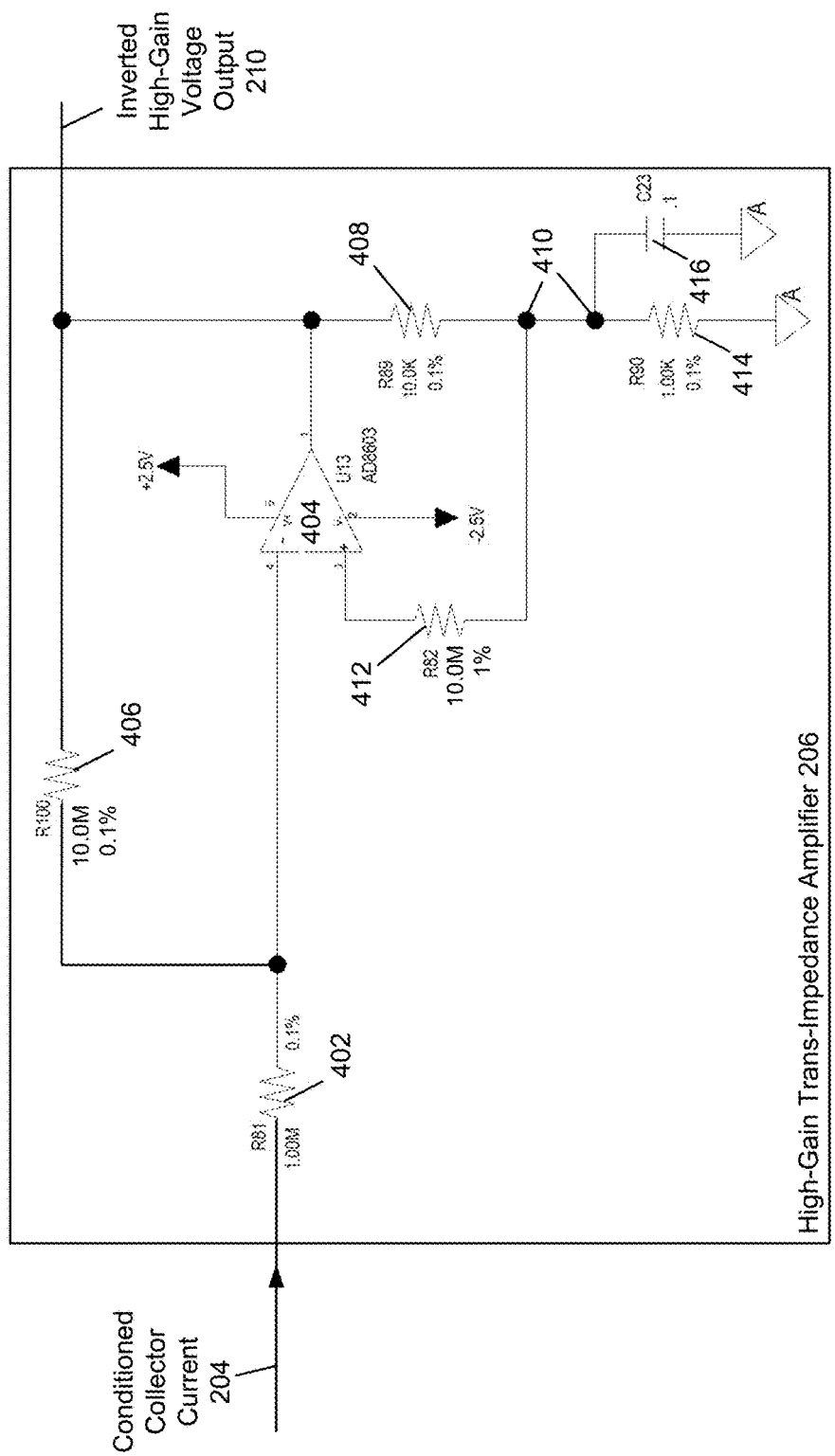
FIG. 4 shows an example embodiment of the high-gain trans-impedance amplifier of FIG. 2.

FIG. 4 shows an example embodiment of the high-gain trans-impedance amplifier 206 of FIG. 2. A 1 MΩ resistor 402 is electrically connected between the conditioned collector current 204 and the negative input of an operational amplifier 404. A 10 MΩ resistor 406 is electrically connected between the output of the operational amplifier 404 and the negative input of the operational amplifier 404. A 10 kΩ resistor 408 is electrically connected between the output of the operational amplifier 404 and a node 410. A 10 MΩ resistor 412 is electrically connected between the node 410 and the negative input of the operational amplifier 404. A 1 kΩ resistor 414 and a 0.1 µF capacitor are electrically connected, in parallel, between the node 410 and analog ground 416. The output of the operational amplifier 404 is also electrically connected to the inverted high-gain voltage output 210.

Figure 5:
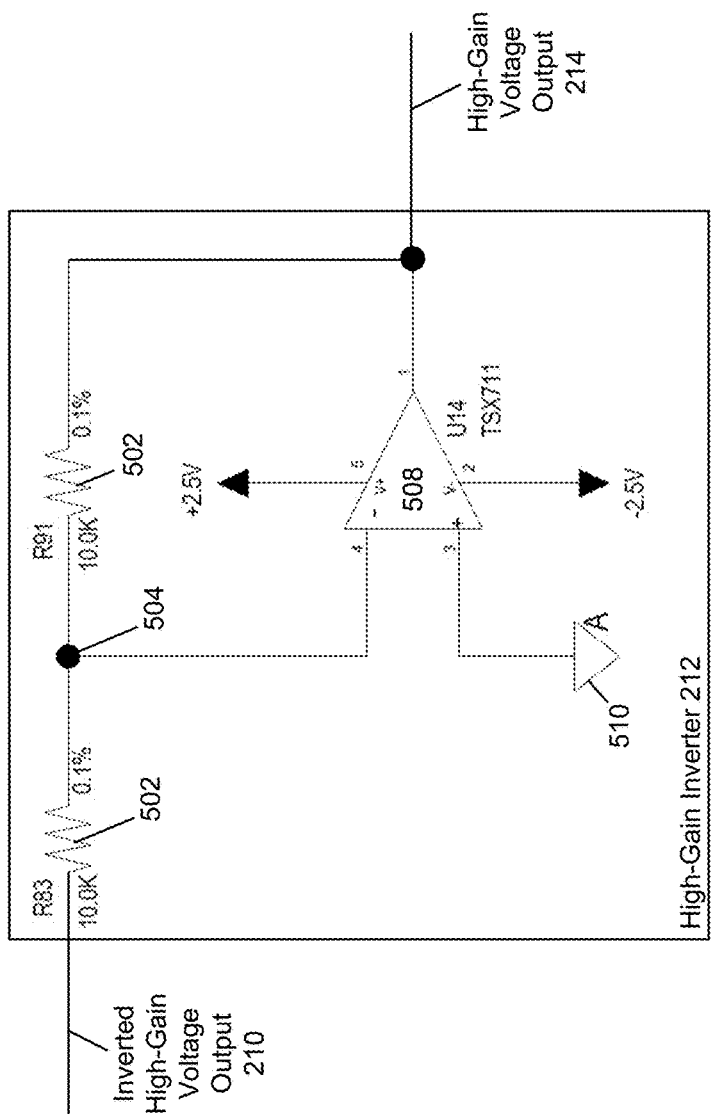
FIG. 5 illustrates an example embodiment of the high-gain inverter of FIG. 2.

FIG. 5 illustrates an example embodiment of the high-gain inverter 212 of FIG. 2, which inverts (i.e., multiplies by −1) the inverted high-gain voltage output 210 from the high-gain trans-impedance amplifier 206. The high-gain inverter 212 includes a 10 kΩ resistor 502 electrically connected between the inverted high-gain voltage output 210 and node 504. A 10 kΩ resistor 506 is electrically connected between node 504 and the output of operational amplifier 508. Node 504 is also electrically connected to the inverting input of the operational amplifier 508. The non-inverting input to the operational amplifier 508 is electrically connected to analog ground 510. The output of the operational amplifier 508 is also electrically connected to the high-gain voltage output 214.

Figure 6:
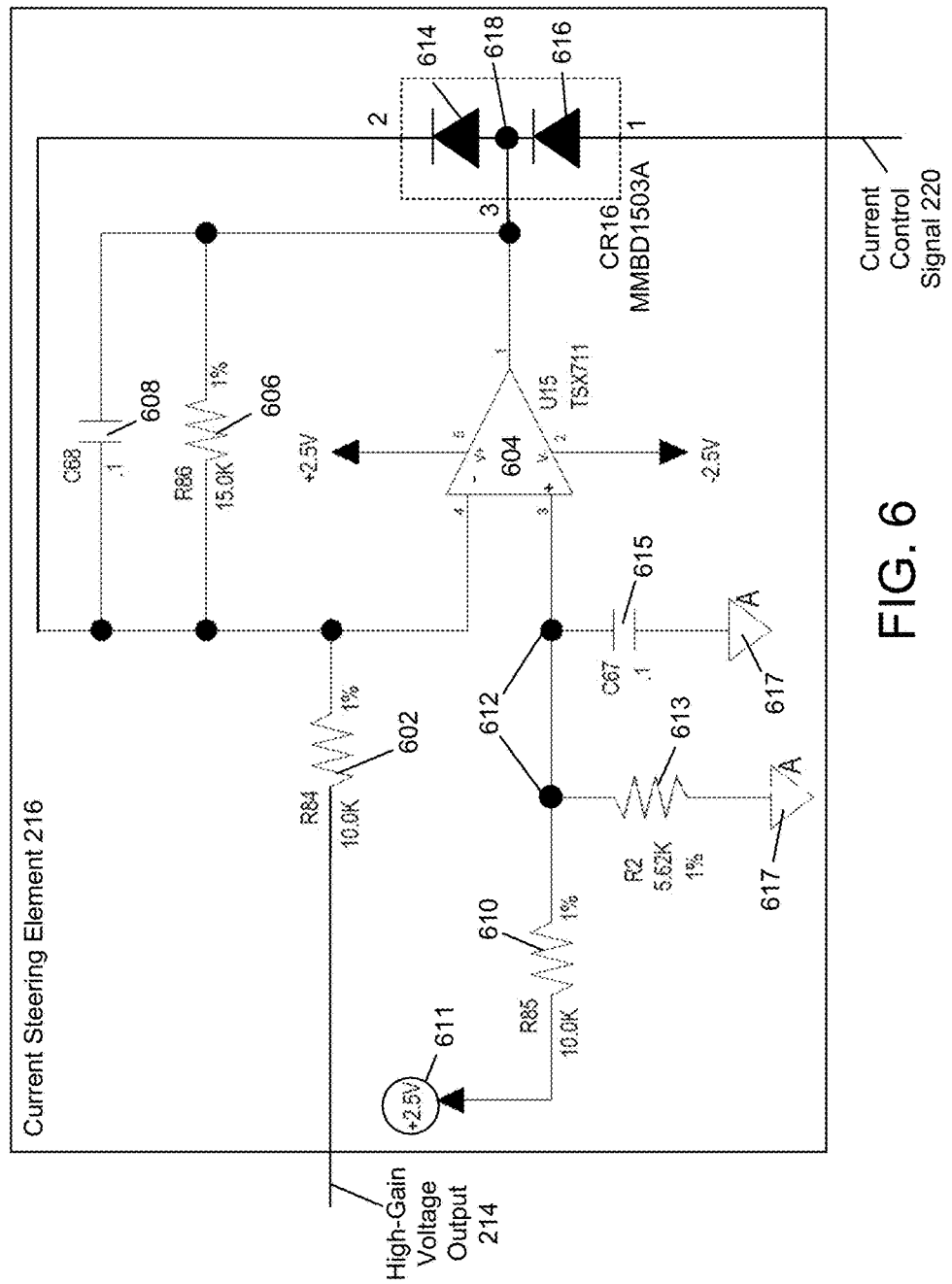
FIG. 6 illustrates an example embodiment of the current steering element of FIG. 2.

FIG. 6 illustrates an example embodiment of the current steering element 216 of FIG. 2, which includes a 10 kΩ resistor 602 electrically connected between the high-gain voltage output 214 and the inverting input of operational amplifier 604. A 15 kΩ resistor 606 and a 0.1 µF capacitor 608 are electrically connected, in parallel, between the inverting input and the output of operational amplifier 604. A 10 kΩ resistor 610 is electrically connected between a +2.5V voltage source 611 and node 612. A 5.62 kΩ resistor 613 and a 0.1 g capacitor 615 are electrically connected, in parallel, between node 612 and analog ground 617. Node 612 is also electrically connected to the non-inverting input of operational amplifier 604. Feedback diode 614 and control diode 616 are electrically connected in series. The anode of feedback diode 614 is electrically connected, at a node 618, to the cathode of control diode 616. The cathode of the feedback diode 614 is electrically coupled to the inverting input of operational amplifier 604, the anode of control diode 616 is electrically coupled to the current control signal 220, and node 618 is electrically coupled to the output of operational amplifier 604.

Figure 7:
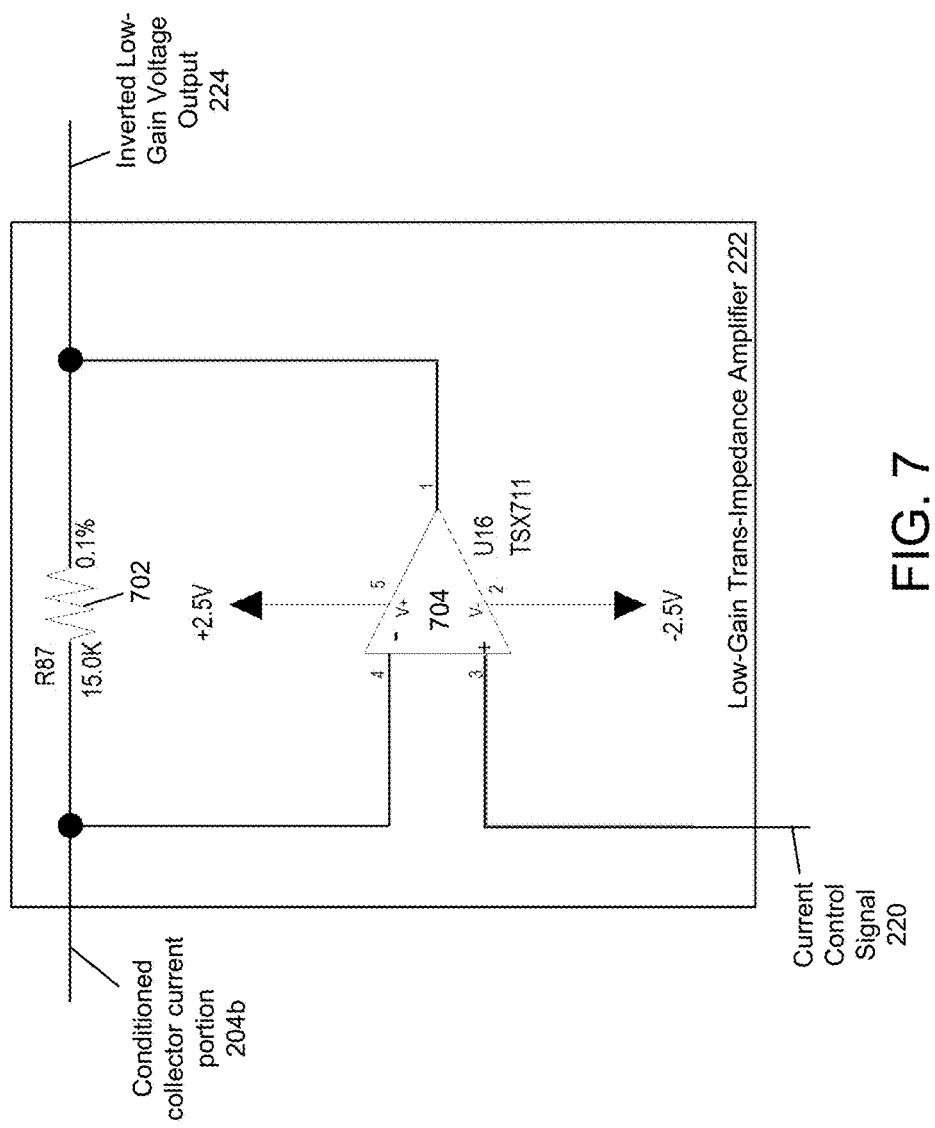
FIG. 7 shows an example embodiment of the low-gain trans-impedance amplifier of FIG. 2.

FIG. 7 shows an example embodiment of the low-gain trans-impedance amplifier 222 of FIG. 2, which includes a 15 kΩ resistor 702 electrically connected between the inverting input of operational amplifier 704. The inverting input of operational amplifier 704 is also electrically coupled to the conditioned collector current portion 204b. The output of operational amplifier 704 is electrically coupled to the inverted low-gain voltage output 224, and the non-inverting input is electrically coupled to the current control signal 220.

Figure 8:
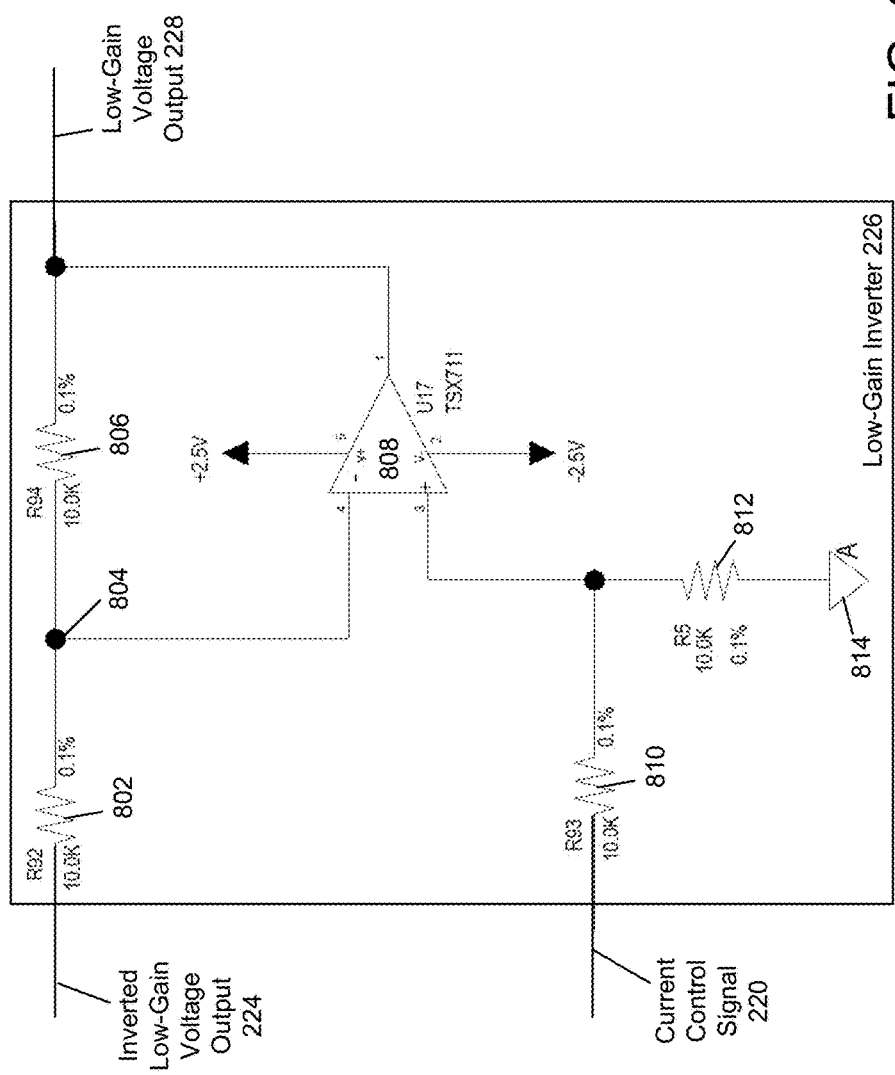
FIG. 8 illustrates an example embodiment of the low-gain inverter of FIG. 2.

FIG. 8 illustrates an example embodiment of the low-gain inverter 226 of FIG. 2, which includes a 10 kΩ resistor 802 electrically connected between the inverted low-gain voltage output 224 and node 804. A 10 kΩ resistor 806 is electrically connected between node 804 and the output of operational amplifier 808. The output of the operational amplifier 808 is also electrically connected to the low-gain voltage output 228. A 10 kΩ resistor 810 is electrically connected between the non-inverting input of the operational amplifier 808 and the current control signal 220. A 10 kΩ resistor 812 is electrically connected between the non-inverting input of the operational amplifier 808 and analog ground 814.

Figure 9:
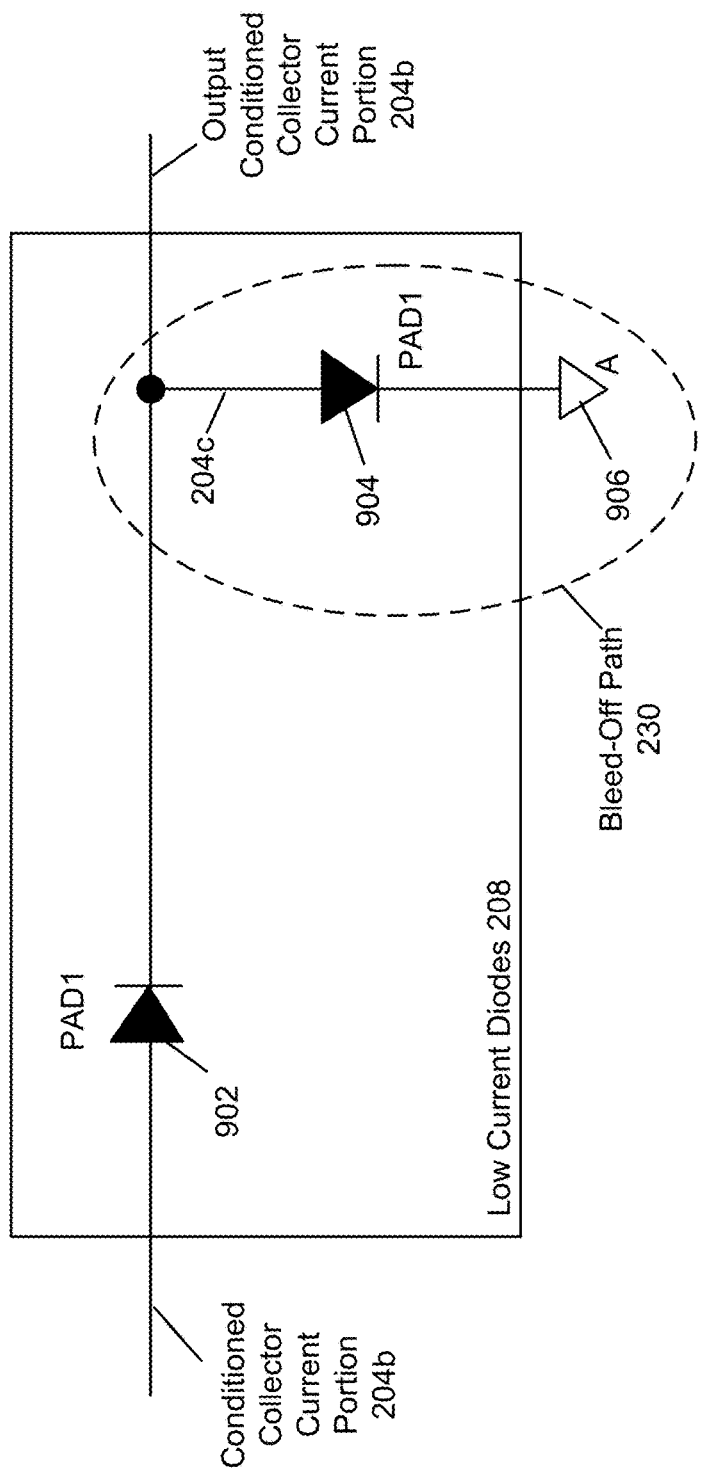
FIG. 9 illustrates an example embodiment of the low current diodes of FIG. 2.

FIG. 9 illustrates an example embodiment of the low current diodes 208 of FIG. 2, which includes a first low current diode 902 with its anode electrically connected to the conditioned collector current portion 204b and its cathode connected to the output conditioned collector current portion 204b. The anode of low current diode 904 is electrically connected to the output conditioned collector current portion 204b and the cathode of low current diode 904 is connected to analog ground 906. Low current diode 902 is referred to herein as the "steering diode," and low current diode 904 is referred to herein as the "bleed-off diode."

Referring again to FIG. 2, the high-gain trans-impedance amplifier 206 is characterized by a "high-gain saturation current," defined herein as a maximum amount of current for which the input-to-output relationship of the high-gain trans-impedance amplifier remains linear (or in some embodiments, at which the input-to-output relationship of the high-gain trans-impedance amplifier 206 begins to become non-linear). Similarly, the low-gain trans-impedance amplifier is characterized by a "low-gain saturation current." The low-gain saturation current is greater than the high-gain saturation current.

As the collector current 204 ranges from 0 A to the high-gain saturation current, the current steering element 216 causes all of the collector current 204 to flow to the high-gain trans-impedance amplifier 206.

As the collector current 204 increases beyond the high-gain saturation current, the steering circuit 216 causes the current 204a to the high-gain trans-impedance amplifier 206 to remain at the high-gain saturation current, while steering the remaining collector current 204, in excess of the high-gain saturation current, to the low-gain trans-impedance amplifier 222.

As the collector current 204 increases beyond the low-gain saturation current, the steering circuit 216 causes the current to the high-gain trans-impedance amplifier 206 to remain at the high-gain saturation current, causes the current to the low-gain trans-impedance amplifier 222 to remain at the low-gain saturation current, and steers the remaining collector current 204, in excess of the sum of the high-gain saturation current and the low-gain saturation current, to the a bleed-off path 230.

For collector currents between 0 A and the high-gain saturation current, the high-gain voltage output 214 increases linearly with the current 204a to the high-gain trans-impedance amplifier 206. As the high-gain voltage output 214 increases, corresponding to an increase in current 204a, the output voltage of operational amplifier 604 decreases (see FIG. 6). As the output voltage of operational amplifier 604 decreases, control diode 616 eventually becomes forward-biased, allowing current to flow through control diode 616 from the output of the operational amplifier 604. This occurs when the current 204a to the high-gain trans-impedance amplifier 206 reaches the high-gain saturation current, and the high-gain voltage output reaches a threshold voltage corresponding to the high-gain saturation current. The current through control diode 616 affects the bias voltage at the input of the low-gain trans-impedance amplifier 222, which in turn forward-biases low current steering diode 902, allowing current 204b to flow through the steering diode 902 to the low-gain trans-impedance amplifier 222.

For collector currents between the high-gain saturation current and the low-gain saturation current, the low-gain voltage output 228 increases linearly with respect to the current 204b into the low-gain trans-impedance amplifier 222. When the current 204b reaches the low-gain saturation current, the low-gain voltage output 228 causes bleed-off diode 904 to become forward-biased, which channels collector current 204, in excess of the sum of the high-gain saturation current and the low-gain saturation current, to pass through bleed-off diode 904 to ground.

While the example embodiments described herein implement certain feedback, control and/or steering elements with diodes (see, for example, FIGS. 6 and 9), it should be understood that these feedback, control and/or steering elements may be implemented in other embodiments with other components (or combinations of components) capable of providing appropriate voltage drops in the steering feedback control path of the wide dynamic range trans-impedance amplifier.

Figure 15:
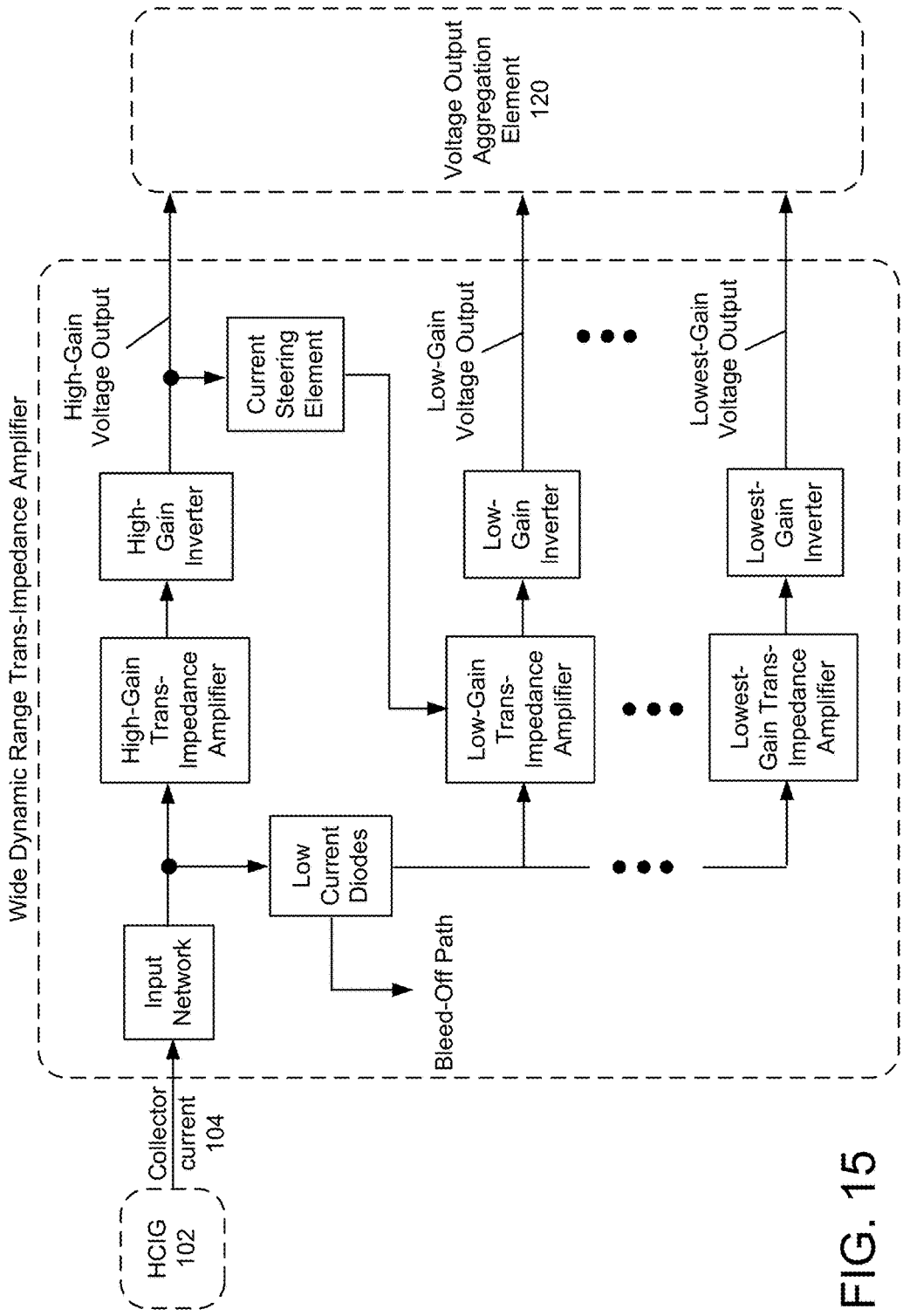
FIG. 15 shows an example embodiment of a multiple-gain-stage wide dynamic range trans-impedance amplifier according to the invention.

Although the embodiment of FIG. 2 describes two trans-impedance amplifiers (high-gain and low-gain), it should be understood that other embodiments may utilize more than two trans-impedance amplifiers. For such embodiments, each of the two or more trans-impedance amplifiers handles a portion of the total dynamic range of the input current, and the current steering circuit controls the portion of input current flowing to each of the two or more trans-impedance amplifiers. In general, the steering circuit operates to maintain each of the two or more trans-impedance amplifiers in a linear input-to-output mode (i.e., non-saturated mode). FIG. 15 illustrates an example embodiment of such a multiple gain stage wide dynamic range amplifier.

Figure 10:
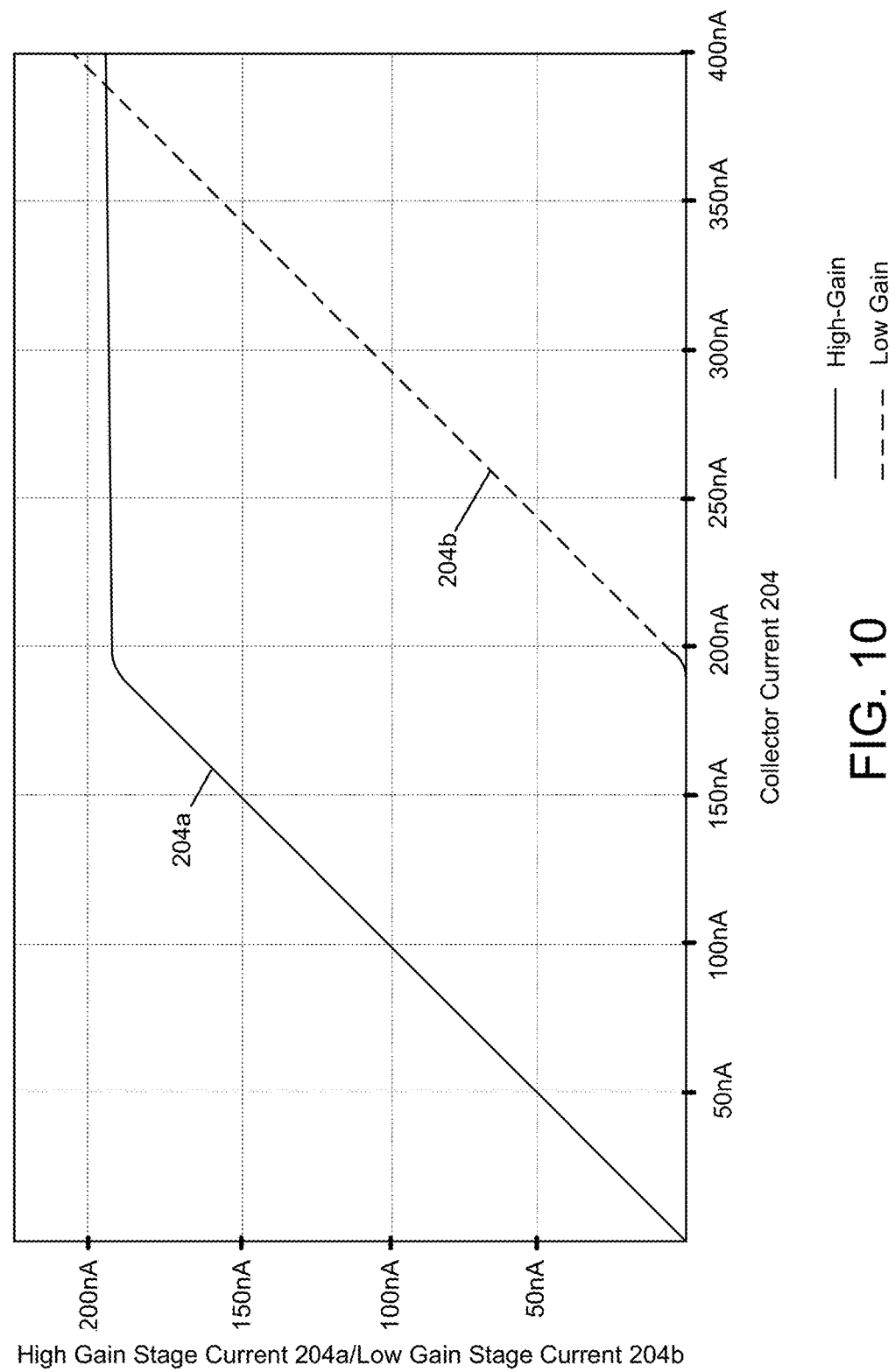
FIGS. 10-12 illustrate the simulated performance of a wide dynamic range trans-impedance amplifier according to the described embodiments.
Figure 11:
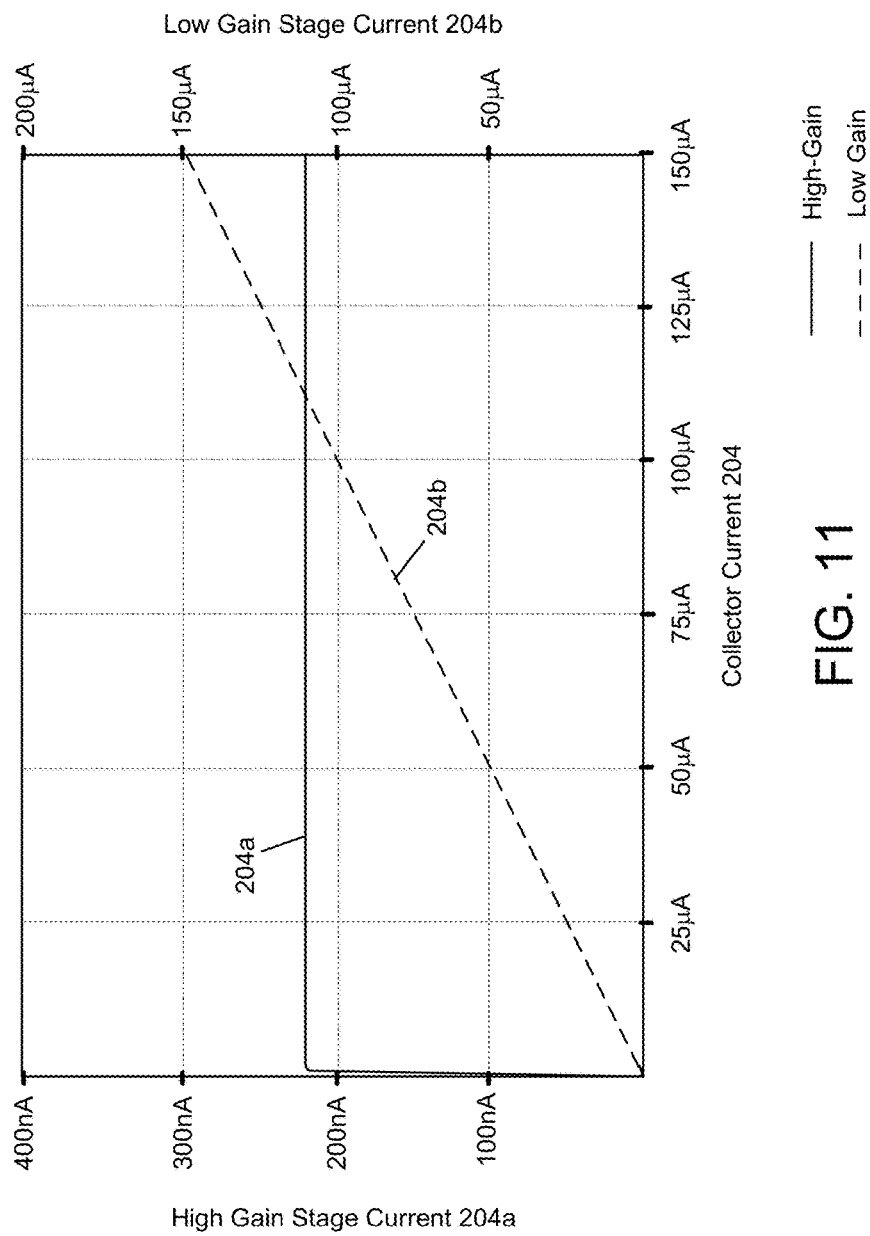
Figure 12:
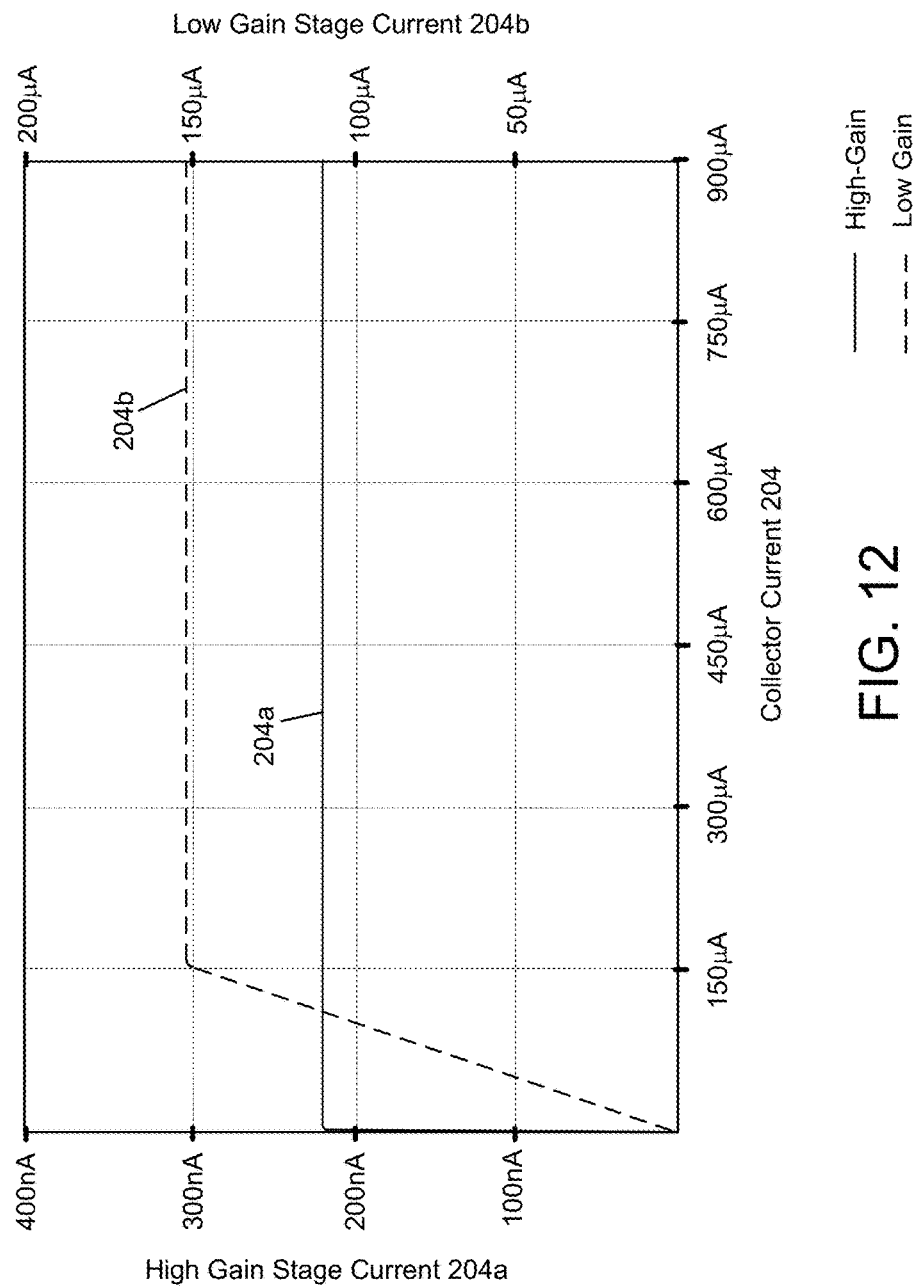

FIGS. 10-12 illustrate the simulated performance of an example wide dynamic range trans-impedance amplifier in terms of gain stage currents with respect to collector current, where the simulation model is constructed according to the described embodiments. FIG. 10 shows collector current within a range of 0 A to 400 nA, FIG. 11 shows collector current within a range of 0 A to 150 µA, and FIG. 12 shows collector current within a range of 0 A to 900 µA.

FIG. 10 shows high gain stage current 204a and low gain stage current 204b as the collector current 204 increases from 0 A to 400 nA. The high gain stage current 204a equals the collector current 204 until the collector current reaches about 190 nA. The low gain stage current 204b remains at about 0 A until the collector current reaches about 190 nA (i.e., the high-gain saturation current for this example). As FIG. 10 illustrates, as the collector current 204 increases beyond about 190 nA, the high gain stage current 204a flattens at about 195 nA, which prevents the high-gain trans-impedance amplifier 206 from entering its saturation mode. Also when the collector current 204 increases beyond about 190 nA, the low gain stage current 204b begins to increase linearly with respect to the collector current 204. This transition point, at about 190 nA of collector current, demonstrates the current steering circuit 216 of the described embodiments causing incremental collector current beyond 190 nA to be directed from the high-gain trans-impedance amplifier 206 to the low-gain trans-impedance amplifier 222.

FIG. 11 shows high gain stage current 204a and low gain stage current 204b as the collector current 204 increases from 0 A to 150 µA. At the collector current scale depicted in FIG. 11 (0 A to 150 µA), the high gain stage current 204a flattens almost immediately. The low gain stage current 204b, on the other hand, remains linear for the entire range of collector current 204.

The upper limit of collector current 204 is expected to be approximately 2 µA, given an emission current of approximately 100 µA. If, however, the emission current increases to 4 mA, instead of the expected 100 µA, the collector current 204 could reach 80 µA. FIG. 11 demonstrates that the low gain stage collector current 204a remains linear up to at least 150 µA of collector current 204, providing approximately two times the amount of dynamic gain necessary for a collector current 204 upper limit of 80 µA.

FIG. 12 shows high gain stage current 204a and low gain stage current 204b as the collector current increases from 0 A to 900 µA (i.e., nearly 1 mA). The collector current range depicted in FIG. 12 represents a collector current that greatly exceeds the expected maximum. The high gain stage current 204a and the low gain stage current 204b remain flat for the entire collector current range depicted in FIG. 13. The high gain stage current 204a remains nearly constant at about 230 nA and the low gain stage current 204b remains nearly constant at about 153 µA, so that neither the high-gain trans-impedance amplifier 206 nor the low-gain trans-impedance amplifier 222 ever goes into a hard saturation mode (from which recovery to linear mode may take an undesirable amount of time).

Figure 13:
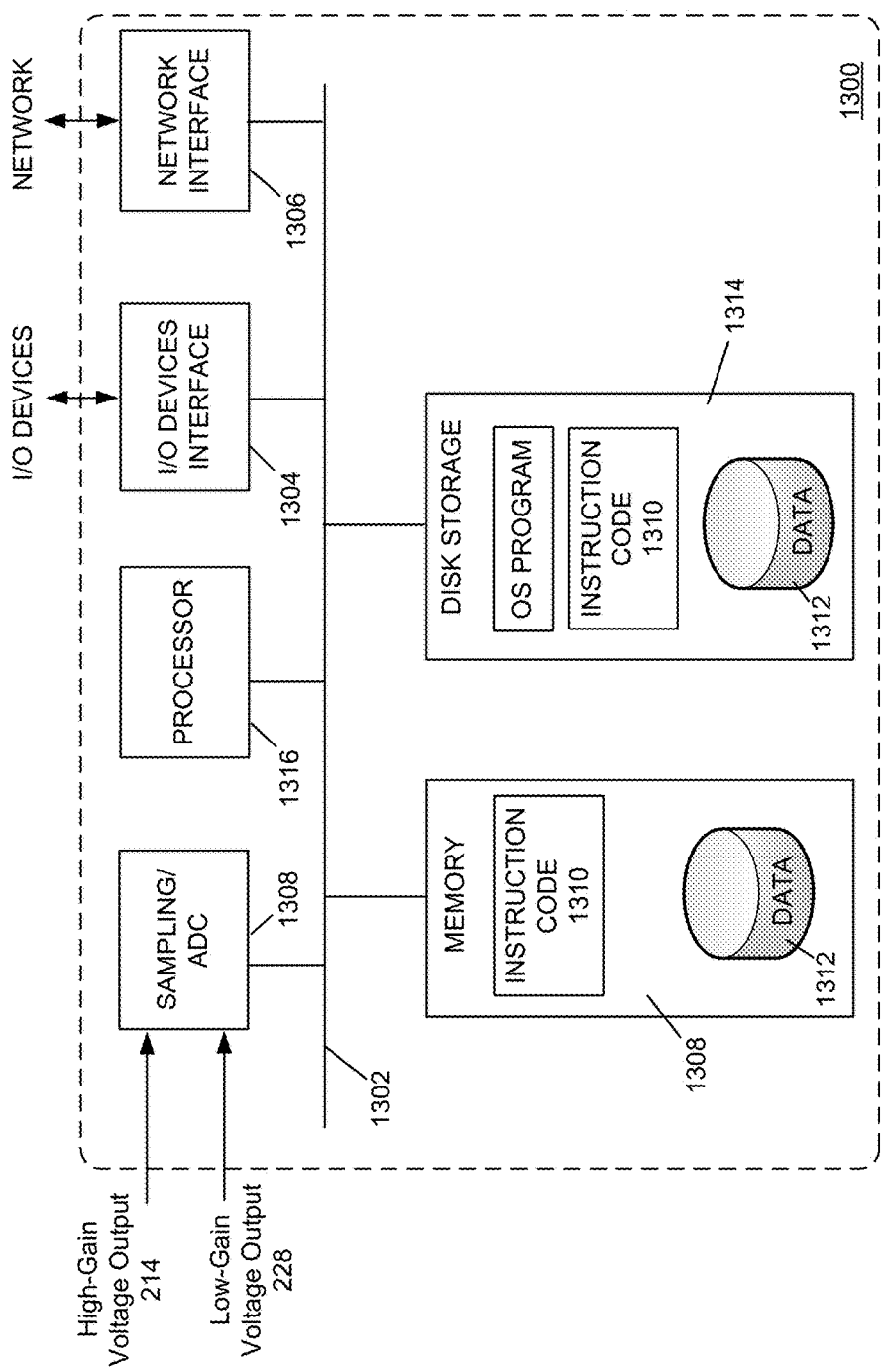
FIG. 13 is a diagram of an example internal structure of a computer system that may be used to implement portions of the described embodiments.

FIG. 13 is a diagram of an example internal structure of a computer system 1300 that may be used to implement portions of the described embodiments, such as the voltage output aggregation element 120. The computer system 1300 includes a system bus 1302, where a bus is a set of hardware lines used for data transfer among the components of a computer or processing system. The system bus 1302 is essentially a shared conduit that connects different elements of a computer system (e.g., processor, disk storage, memory, input/output ports, network ports, etc.) that enables the transfer of information between the elements.

Attached to the system bus 1302 is an I/O device interface 1304 for connecting various input and output devices (e.g., keyboard, mouse, displays, printers, speakers, etc.) to the computer system 1300. A network interface 1306 allows the computer to connect to various other devices attached to a network. Memory 1308 provides volatile storage for computer software instruction code 1310 and data 1312 used to implement one or more of the described embodiments. Disk storage 1314 provides non-volatile storage for computer software instructions 1310 and data 1312 used to implement an embodiment of the present invention. A central processor unit 1316 is also attached to the system bus 1302 and provides for the execution of computer instructions.

A sampling/ADC element 1318 may sample the high-gain voltage output 214 and the low-gain voltage output 228 to produce digital samples representing the high-gain voltage output 214 and the low-gain voltage output 228. The processor instructions 1310 may cause the processor 1316 to manipulate the sampled information, for example by storing the sampled information in memory 1308 or disk storage, or by performing the collector current determining equation described herein.

In one embodiment, the processor instructions 1310 and data 1312 are a computer program product, including a non-transitory computer-readable medium (e.g., a removable storage medium such as one or more DVD-ROM's, CD-ROM's, diskettes, tapes, etc.) that provides at least a portion of the instruction code for the described embodiments. The computer program product can be installed by any suitable software installation procedure, as is well known in the art. In another embodiment, at least a portion of the software instructions may also be downloaded over a cable communication and/or wireless connection.

Figure 14:
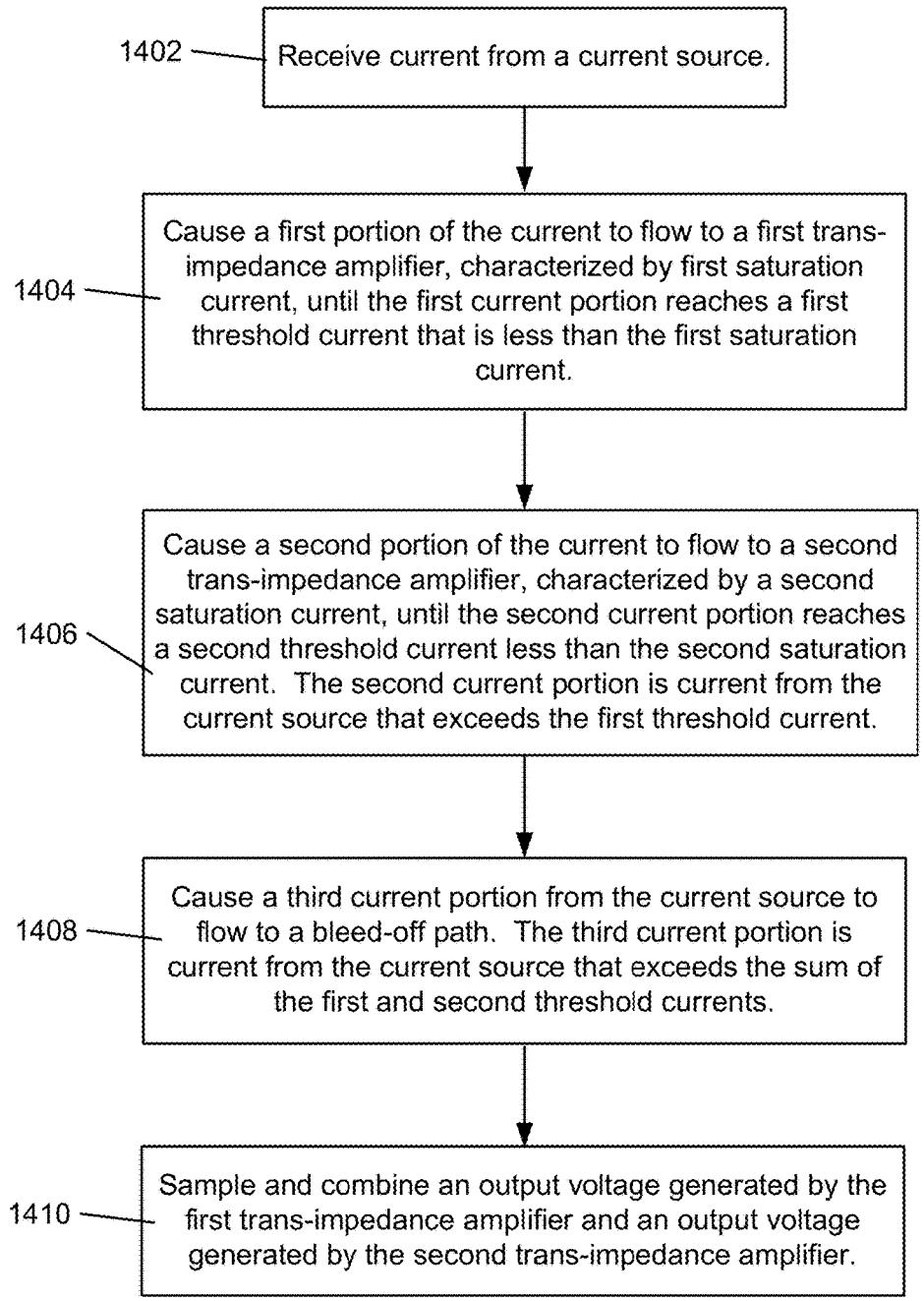
FIG. 14 shows an example method of amplifying a current having a wide dynamic range according to the described embodiments.

FIG. 14 shows an example method of amplifying a current having a wide dynamic range. The example method includes receiving 1402 current from a current source, for example the collector current from a hot cathode ionization gauge. The method further includes causing 1404 the received current to flow to a first trans-impedance amplifier, which is characterized by first saturation current, until the first current portion reaches a first threshold current. The method further includes causing 1406 a second portion of the current to flow to a second trans-impedance amplifier, which is characterized by a second saturation current, until the second current portion reaches a second threshold current that is less than the second saturation current, the portion of current to the second trans-impedance amplifier being current from the current source that exceeds the first threshold current. The method further includes causing 1408 a third current portion from the current source to flow to a bleed-off path. The third current portion is current from the current source that exceeds the sum of the first saturation current and the second saturation current. The method also includes sampling and combining 1410 an output voltage generated by the first trans-impedance amplifier, and an output voltage generated by the second trans-impedance amplifier.

While this invention has been particularly shown and described with references to example embodiments thereof, it will be understood by those skilled in the art that various changes in form and details may be made therein without departing from the scope of the invention encompassed by the appended claims.

What is claimed is:

1. A wide dynamic range trans-impedance amplifier, comprising:
    a first trans-impedance amplifier configured to receive a first input current and produce a first voltage being a function of the first input current, the first trans-impedance amplifier characterized by a first saturation current at which the first trans-impedance amplifier ceases to produce the first voltage as a linear function of the first input current, and the first trans-impedance amplifier having a first gain characteristic;
    a second trans-impedance amplifier configured to receive a second input current and produce a second voltage being a function of the second input current, the second trans-impedance amplifier characterized by a second saturation current at which the second trans-impedance amplifier ceases to produce the second voltage as a linear function of the second input current, and the second trans-impedance amplifier having a second gain characteristic; and
    a current steering element configured to:
        cause the first input current to flow from a current source to the first trans-impedance amplifier until the first input current reaches a first threshold current that is less than the first saturation current; and
        when the first input current reaches the first threshold current, cause the second input current to flow from the current source to the second trans-impedance amplifier until the second input current reaches a second threshold current that is less than the second saturation current, the second input current being current from the current source that exceeds the first threshold current.

2. The amplifier of claim 1, wherein the current steering element is further configured to cause an excess portion of current from the current source to flow to a bleed-off path when the second input current to the second trans-impedance amplifier reaches the second threshold current, wherein the excess portion of current is current from the current source that exceeds a sum of the first threshold current and the second threshold current.

3. The amplifier of claim 1, further including one or more additional trans-impedance amplifiers, wherein the current steering element is further configured to cause one or more additional portions of the excess portion of current to flow to each subsequent trans-impedance amplifier of the one or more additional trans-impedance amplifiers, until the additional current portion flowing to the subsequent trans-impedance amplifier reaches a subsequent threshold current corresponding to the subsequent trans-impedance amplifier.

4. The amplifier of claim 1, further including a voltage output aggregation element configured to:
    sample the first voltage and the second voltage;
    determine a first ratio of the first voltage to a feedback resistance associated with the first trans-impedance amplifier;
    determine a second ratio of the second voltage to a feedback resistance associated with the second trans-impedance amplifier; and
    add the first ratio and the second ratio to produce an estimate of the source current.

5. The amplifier of claim 4, further including:
    an analog-to-digital converter (ADC) configured to digitize the first voltage producing a first digitized voltage, and to digitize the second voltage producing a second digitized voltage; and
    a processor system configured to generate the first ratio and the second ratio, and to add the first ratio and the second ratio to produce an estimate of the source current.

6. The amplifier of claim 1, wherein the current steering element is configured to control the first input current and the second input current based on the first voltage, by causing a control diode to become forward-biased as the first voltage increases beyond a first threshold voltage.

7. The amplifier of claim 6, wherein the control diode becoming forward-biased is configured to cause a steering diode to become forward biased, which conveys the second input current from the current source to the second trans-impedance amplifier.

8. The amplifier of claim 7, wherein the steering diode becomes forward-biased by modifying an input bias voltage of the second trans-impedance amplifier.

9. The amplifier of claim 1, wherein the first gain characteristic is greater than the second gain characteristic.

10. The amplifier of claim 1, wherein the second input current begins flowing without a discontinuity as the first current to the first trans-impedance amplifier reaches the first threshold current.

11. A method of amplifying a current from a current source, the current having a wide dynamic range, comprising:
    causing the current to flow to a first trans-impedance amplifier, characterized by a first gain characteristic and a first saturation current;
    when the current to the first trans-impedance amplifier reaches a first threshold current that is less than the first saturation current, causing a portion of the current from the current source to flow to a second trans-impedance amplifier characterized by a second gain characteristic and a second saturation current, until the portion of current to the second trans-impedance amplifier reaches a second threshold current that is less than the second saturation current, the portion of current to the second trans-impedance amplifier being current from the current source that exceeds the first threshold current.

12. The method of claim 11, further including causing an excess portion of current from the current source to flow to a bleed-off path when the current to the second trans-impedance amplifier reaches the second threshold current, the excess current portion being current from the current source that exceeds a sum of the first threshold current and the second threshold current.

13. The method of claim 11, further including causing one or more additional portions of the excess current portion to flow to each of one or more additional trans-impedance amplifiers, until the additional current portion flowing to a subsequent trans-impedance amplifier of the one or more additional trans-impedance amplifiers reaches a subsequent threshold current corresponding to the subsequent trans-impedance amplifier.

14. The method of claim 11, further including:
sampling a first voltage from the first trans-impedance amplifier, the first voltage being a function of the current to the first trans-impedance amplifier;
sampling a second voltage from the second trans-impedance amplifier, the second voltage being a function of the current to the second trans-impedance amplifier;
determining a first ratio of the first voltage to a feedback resistance associated with the first trans-impedance amplifier;
determining a second ratio of the second voltage to a feedback resistance associated with the second trans-impedance amplifier; and
adding the first ratio and the second ratio to produce an estimate of the current from the current source.

15. The method of claim 14, further including:
digitizing the first voltage to produce a first digitized voltage;
digitizing the second voltage to produce a second digitized voltage; and
generating, by a processor system, the first ratio, the second ratio, and a sum of the first ratio and the second ratio to produce an estimate of the current from the current source.

16. The method of claim 14, further including controlling the current to the first trans-impedance amplifier and the current to the second trans-impedance amplifier based on the first voltage, by causing a control diode to become forward-biased as the first voltage increases beyond a first threshold voltage.

17. The method of claim 16, further including causing a steering diode to become forward-biased, as a result of the control diode becoming forward-biased, and convey current from the current source to the second trans-impedance amplifier.

18. The method of claim 17, further including causing the steering diode to become forward-biased by modifying an input bias voltage of the second trans-impedance amplifier.

19. A non-transitory computer-readable medium with computer code instruction stored thereon, the computer code instructions, when executed by an a processor, cause an apparatus to:

sample a first voltage from a first trans-impedance amplifier, the first voltage being a function of a first input current to the first trans-impedance amplifier;
sample a second voltage from a second trans-impedance amplifier, the second voltage being a function of a second input current to the second trans-impedance amplifier;
determine a first ratio of the first voltage to a feedback resistance associated with the first trans-impedance amplifier;
determine a second ratio of the second voltage to a feedback resistance associated with the second trans-impedance amplifier; and
add the first ratio and the second ratio to produce an estimate of a source current consisting of the first input current and the second input current;
the first trans-impedance amplifier configured to receive a first input current and produce a first voltage as a function of the first input current, the first trans-impedance amplifier characterized by a first saturation current at which the first trans-impedance amplifier ceases to produce the first voltage as a linear function of the first input current, and the first trans-impedance amplifier having a first gain characteristic;
the second trans-impedance amplifier configured to receive a second input current and produce a second voltage as a function of the second input current, the second trans-impedance amplifier characterized by a second saturation current at which the second trans-impedance amplifier ceases to produce the second voltage as a linear function of the second input current, and the second trans-impedance amplifier having a second gain characteristic; and
the first trans-impedance amplifier and the second trans-impedance amplifier being coupled to a current steering element configured to:
cause the first input current to flow from a current source to the first trans-impedance amplifier until the first input current reaches a first threshold current that is less than the first saturation current; and
when the first input current reaches the first threshold current, cause the second input current to flow from the current source to the second trans-impedance amplifier until the second input current reaches a second threshold current that is less than the second saturation current, the second input current being current from the current source that exceeds the first threshold current.

20. The non-transitory computer-readable medium of claim 19, the computer code instructions, when executed by an a processor, further cause an apparatus to digitize, using an analog-to-digital converter (ADC), the first voltage to produce a first digitized voltage, and to digitize the second voltage to produce a second digitized voltage.

21. A non-transitory computer-readable medium with computer code instruction stored thereon, the computer code instructions, when executed by an a processor, cause an apparatus to:
sample a first voltage from a first trans-impedance amplifier, the first voltage being a function of a first input current to the first trans-impedance amplifier;
sample a second voltage from a second trans-impedance amplifier, the second voltage being a function of a second input current to the second trans-impedance amplifier;

determine a first ratio of the first voltage to a feedback resistance associated with the first trans-impedance amplifier;

determine a second ratio of the second voltage to a feedback resistance associated with the second trans-impedance amplifier;

add the first ratio and the second ratio to produce an estimate of a source current consisting of the first input current and the second input current; and digitize, using an analog-to-digital converter (ADC), the first voltage to produce a first digitized voltage, and to digitize the second voltage to produce a second digitized voltage.

\* \* \* \* \*